United States Patent
Bruckmann et al.

(10) Patent No.: US 6,456,516 B1
(45) Date of Patent: Sep. 24, 2002

(54) PROVISION OF A LOW-INDUCTIVE RAIL FOR THREE-POINT PHASE MODULE

(75) Inventors: Manfred Bruckmann, Nürnberg; Tomas Greif, Röttenbach; Anton Pfauser, Pommersfelden, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/744,425
(22) PCT Filed: Jul. 12, 1999
(86) PCT No.: PCT/DE99/02149
§ 371 (c)(1),
(2), (4) Date: Mar. 20, 2001
(87) PCT Pub. No.: WO00/07288
PCT Pub. Date: Feb. 10, 2000

(30) Foreign Application Priority Data

Jul. 24, 1998 (DE) .......................... 195 33 491

(51) Int. Cl.$^7$ .............................................. H02M 1/00
(52) U.S. Cl. ................................................. 363/144
(58) Field of Search ................................ 363/140, 144; 257/700, 701, 723, 724, 725; 361/624, 637, 648

(56) References Cited

U.S. PATENT DOCUMENTS

| | | | |
|---|---|---|---|
| 5,053,918 A | * 10/1991 | Norden | ........................ 361/355 |
| 5,132,896 A | 7/1992 | Nishizawa et al. | |
| 5,206,777 A | * 4/1993 | Clarey et al. | .................. 361/63 |
| 5,528,073 A | 6/1996 | Gilmore | |
| 5,574,312 A | 11/1996 | Reinhold | |

FOREIGN PATENT DOCUMENTS

| | | |
|---|---|---|
| DE | 4020026 | 10/1991 |
| DE | 09408387 | 4/1994 |
| DE | 4402425 | 8/1994 |
| DE | 19512679 | 11/1996 |
| DE | 19600367 | 7/1997 |
| WO | 9408387 | 4/1994 |
| WO | 9713316 | 4/1994 |
| WO | 09713316 | 4/1997 |

OTHER PUBLICATIONS

Design Aspects for Inverters with IGBT High Power Modules, World Sales meeting 1997.

Dr. Schütze, *Design Aspects for Inverters with IGBT High Power Modules*, Eupec, MOD–M, Mar. 9, 1997.

German article, L. Abraham, *ETG–Fachbericht 39*: "Bauelemente der Leistungselektronic and ihre Anwendungen"; vde–verlag gmbh; May 14, 1992.

* cited by examiner

*Primary Examiner*—Matthew Nguyen
(74) *Attorney, Agent, or Firm*—BakerBotts LLP

(57) ABSTRACT

A low-inductive busbar arrangement for a three-point phase module of a polyphase three-point power converter is provided. At least one turn-off semiconductor switched being provided for each switch of this three-point phase module and at least one diode being provided for each of the two neutral point diodes. Connection busbars of this three-point-phase module are distributed between three busbar planes of the low-inductive busbar arrangement, which are mutually electrically insulated from one another in each case with insulation layer and are arranged in a plan-parallel manner. A low-inductive busbar arrangement for a three-point phase module is thus obtained which has three busbar planes, irrespective of the series connection number.

16 Claims, 11 Drawing Sheets

PROVISION OF A LOW-INDUCTIVE RAIL FOR THREE-POINT PHASE MODULE

BACKGROUND OF THE INVENTION

The present invention relates to a low-inductive busbar arrangement for a three-point phase module of a polyphase three-point power converter, and to a low-inductive busbar arrangement of said three-point power converter.

In power converters which use fast-switching turn-off power semiconductor switches, for example Insulated Gate Bipolar Transistor (IGBT), care should be taken to ensure that the value of the leakage inductance of the connections between these turn-off power semiconductor switches and the intermediate circuit capacitors is minimized. This limits the voltage spikes both during turn-on and during turn-off of the power semiconductor switches, in order to avoid relatively high loading or even destruction of the power semiconductor switches. In order to minimize the leakage inductance, the connections and the leads are embodied as a busbar arrangement.

A low-inductive busbar arrangement for a two-point power converter having fast-switching turn-off power semiconductor switches has two busbars which are routed in a plane-parallel manner and are electrically insulated from one another by means of an insulating layer. The current in these two busbars must flow in opposite directions to ensure that the leakage inductance of this busbar arrangement becomes minimal. Appropriately configured copper plates are generally used as busbars. The distance between the two busbars is determined by the insulating layer, the thickness thereof being dependent on the voltage load. The areas of the busbars which overlap in the current path should be maximal, the overall construction of the power converter forming a natural limit to this. Various design proposals for a two-point inverter were presented by Dr. Schutze on Mar. 9, 1997 at the World Sales Meeting of the firm eupec.

In the paper "IGBT-Wechselrichter fur Antriebe in Industrie und Verkehr" [IGBT inverters for drives in industry and transport] by Dr. Salama and Dr. Tadros, printed in ETG-Fachbericht 39 (papers of the ETG specialist conference on May 13 and 14, 1992 in Bad Nauheim), pages 281 to 295, a multilayer technology having all connections and leads within the power section is used as low-inductive busbar arrangement of an IGBT three-point inverter. In accordance with FIG. 4 of this specialist paper, this involves a five-layer conductor routing. A multilayer of this type is compact and, at the same time, is a support plate for snuffer and/or intermediate circuit capacitors and for the drive units of the individual fast-switching turn-off power semiconductor switches. Depending on the DC input voltage used for the IGBT inverter, the number of layers of the multilayer increases, and thus so, too, does the outlay for creating such a multilayer. A further significant disadvantage of this busbar arrangement technology resides in the costs of the multilayer.

In the event of a fault, for example a defect on one of the twelve IGBTs or on one of the 14 diodes, the outlay for exchanging an IGBT or a diode is very costly since the entire three-point inverter has to be disassembled. A further disadvantage of this multilayer is that if a line break occurs in one conductor plane, the entire multilayer must be exchanged for a new one. This operation is also labor-intensive and time-consuming. Moreover, a fabricated multilayer can only be used for one embodiment of an IGBT inverter. If, for a switch of the three-point inverter, not one IGBT but two or three IGBTs which are electrically connected in series are intended to be used owing to the higher DC input voltage, then it is necessary to develop a completely new multilayer in which at least the number of conductor planes is likewise increased. In other words, different multilayers are required for a three-point inverter with the series connection number One, Two or Three.

SUMMARY OF THE INVENTION

The present invention is based on the object of specifying a low-inductive busbar arrangement for a three-point phase module of a polyphase three-point power converter which has a small number of layers and can be expanded in a simple manner.

By virtue of the fact that the individual different busbars of a three-point phase module are divided between three busbar planes of the inductive busbar arrangement, which are mutually electrically insulated from one another in each case by means of insulation layers and are arranged in a plane-parallel manner, a compact low-inductive busbar arrangement can be obtained which has only three busbar planes. If, in a three-point phase module, not one semiconductor switch but two or three semiconductor switches are used for a respective switch, then it is possible to arrange additional busbars of the three-point phase module with a series connection number greater than one in at least one busbar plane. Consequently, the low-inductive busbar arrangement according to the present invention continues to have only three busbar planes, but the number of busbars within the busbar planes increases.

In one embodiment of the low-inductive busbar arrangement for a three-point phase module according to the present invention with the series connection number One, a load terminal busbar, a positive and a negative intermediate circuit terminal busbar are arranged in one busbar plane, a branch busbar is arranged in a next busbar plane and a neutral point terminal busbar is arranged in a further busbar plane. The arrangement of these three busbar planes relative to one another is arbitrary, an arrangement in which the busbar plane with the neutral point terminal busbar is used as an outer busbar plane being particularly advantageous.

If, for each switch of the three-point phase module, not one semiconductor switch but two or three semiconductor switches are used (series connection number Two or Three), then a three-point phase module of this type also additionally has connection busbars which are arranged in a busbar plane of the low-inductive busbar arrangement, the branch busbars advantageously being arranged in the busbar plane which already has the load terminal busbar and a positive and negative intermediate circuit terminal busbar. This division of the various busbars of a three-point phase module between three busbar planes means that the busbar arrangement can be adapted to the electrical construction of the phase module in a simple manner.

By way of example, if the semiconductor switches used are increased from two to three per switch of the three-point phase module, only six further connection busbars are required, which are additionally arranged in the corresponding busbar plane. Since, when the number of semiconductor switches per switch of the three-point phase module is increased, the spatial extent of this three-point phase module increases, there is enough space in the corresponding busbar plane for accommodating further connection busbars.

In a further advantageous embodiment of the low-inductive busbar arrangement for a three-point phase module, the neutral point terminal busbar is designed in such a way that this covers the busbars of the other two busbar planes. This configuration of the neutral point terminal busbar further reduces the value of the leakage inductance.

In a further advantageous embodiment of the low-inductive busbar arrangement for a three-point phase module, the neutral point terminal busbar is designed in such a way that the terminal lugs of the intermediate circuit terminal busbars are likewise covered. This embodiment of the neutral point terminal busbar reduces the value of the leakage inductance even further.

In a further advantageous embodiment of the low-inductive busbar arrangement, the three busbar planes are adhesively bonded to one another. A compact design is thus obtained for the busbar arrangement, with the result that the assembly outlay for a three-point phase module is considerably reduced and simplified. Moreover, the adhesive-bonding layers perform the function of insulation between adjacent busbar planes.

In a further advantageous embodiment of the low-inductive busbar arrangement for a three-point phase module, the connection busbars are configured uniformly. This means that the existing space of a busbar plane can be utilized optimally in terms of area. Moreover., the stock-keeping of the busbars and the assembly of the low-inductive busbar arrangement are simplified.

In a further advantageous embodiment of the low-inductive busbar arrangement for a three-point phase module, the connection busbars of the upper and lower bridge half, respectively, of the three-point phase module are spatially arranged in a row in each case, these being spatially arranged next to one another. This halves the length of the low-inductive busbar arrangement, which means, moreover, that the intermediate circuit terminal and the load terminal busbars can be arranged spatially oppositely in a busbar plane.

This configuration of a low-inductive busbar arrangement for a three-point phase module according to the present invention means that it is now possible to combine three such low-inductive busbar arrangements by means of a two-layer intermediate circuit busbar system to form a low-inductive busbar arrangement for a polyphase three-point power converter, without major outlay of time and expense.

In order to elucidate an exemplary embodiment of the present invention in further detail, reference is made to the drawings, which schematically illustrate a low-inductive busbar arrangement for a three-point phase module.

BRIEF DESCRIPTION OF THE DRAWINGS

In order to elucidate an exemplary embodiment of the present invention in further detail, reference is made to the drawings, which schematically illustrate a low-inductive busbar arrangement for a three-point phase module.

DETAILED DESCRIPTION

Figure 1:
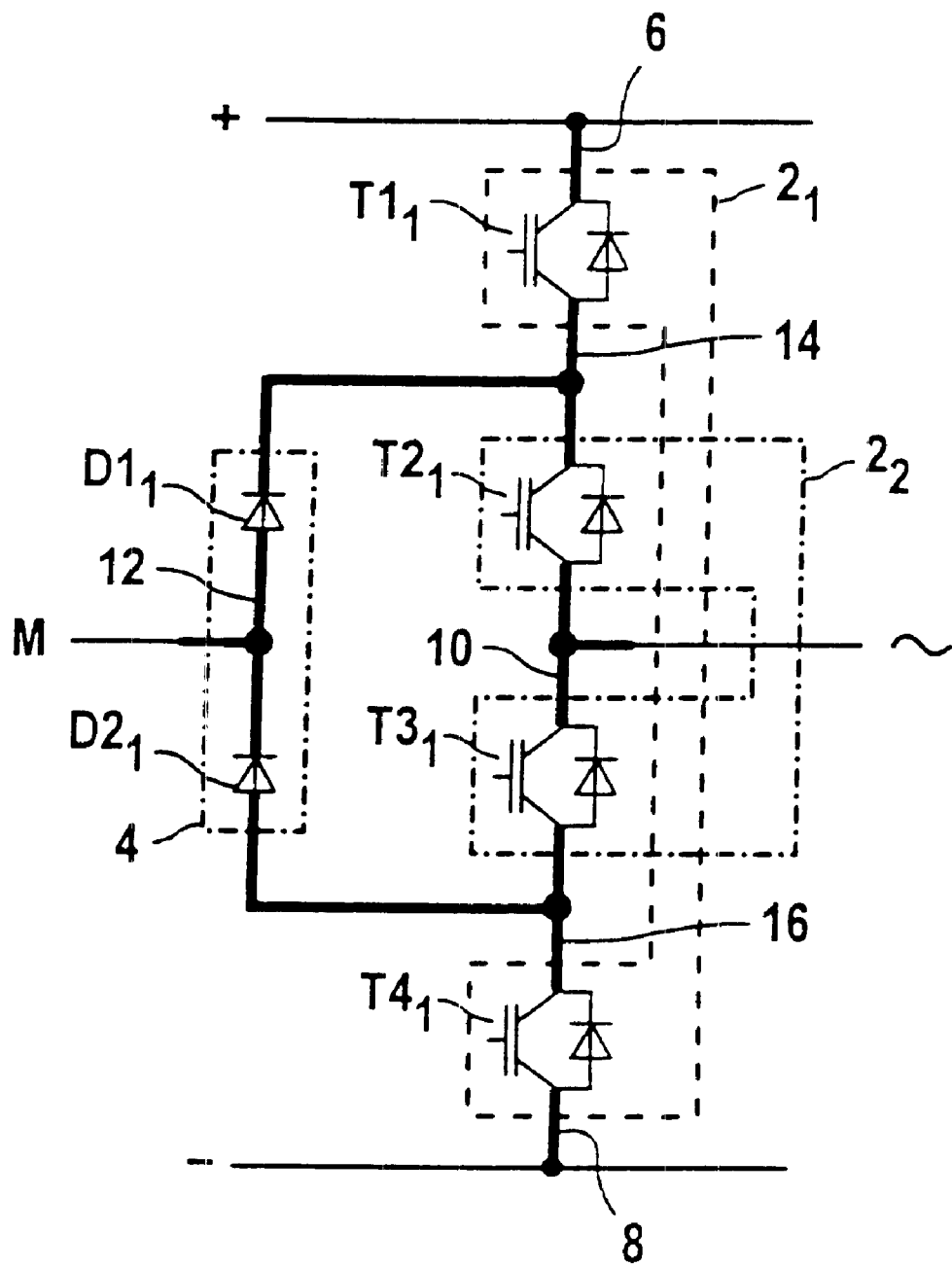
FIG. 1 shows an exemplary circuit diagram of a bridge arm of a three-point phase module with one turn-off semi-conductor switch per switch (series connection number One)
Figure 2:
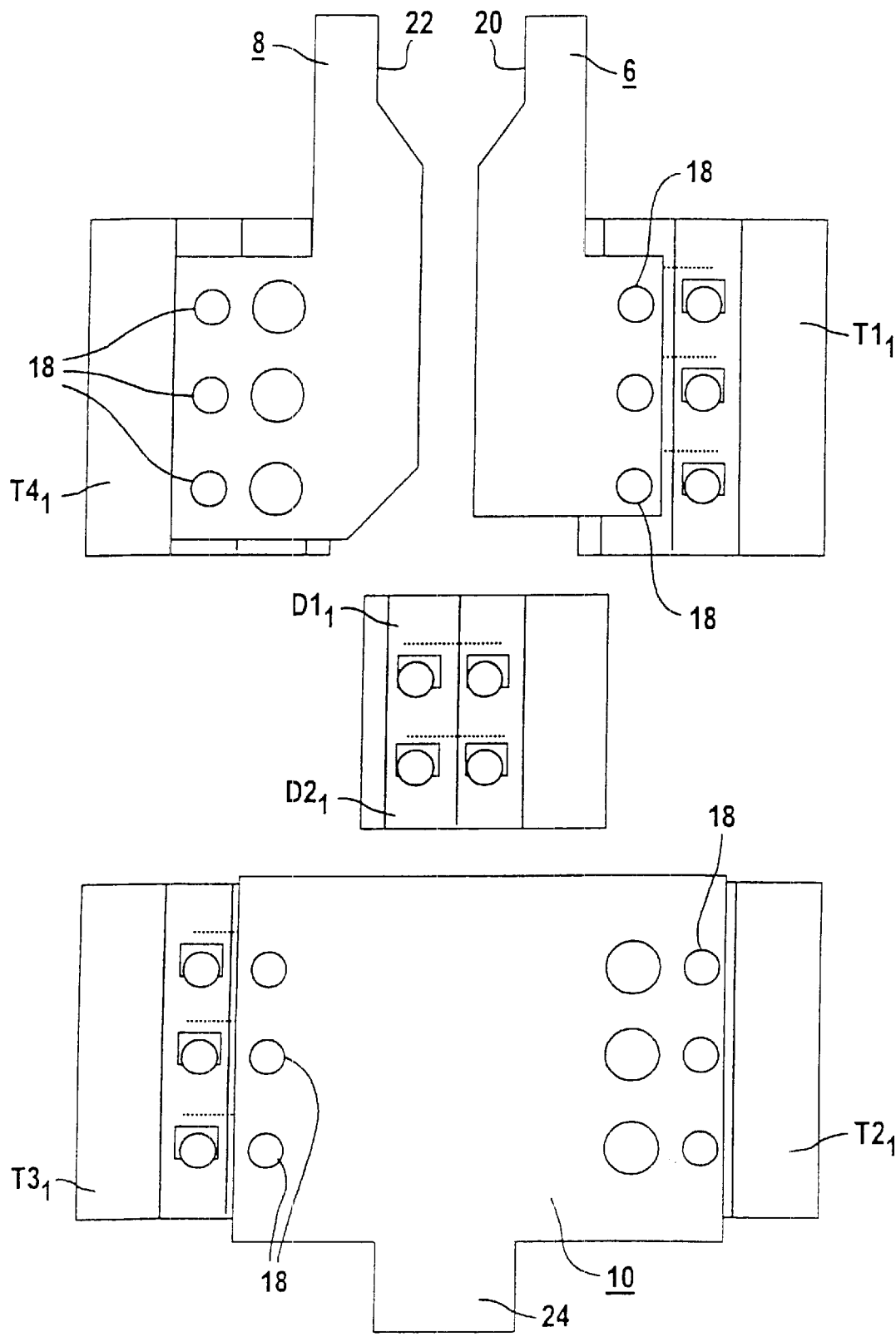
FIG. 2 illustrates a plan view of a busbar plane of the low-inductive busbar arrangement according to the present invention, for a three-point phase module according to FIG. 1

FIG. 1 shows an exemplary circuit diagram of a bridge arm of a three-point phase module, which has in each case one semiconductor switch $T1_1$, $T2_1$, $T3_1$ and $T4_1$, per switch of the bridge arm and two neutral point diodes $D1_1$, and $D2_1$. The semiconductor switches $T1_1$, $T4_1$ and $T2_1$, $T3_1$ are spatially arranged next to one another in each case. This is illustrated in each case by an interrupted line $2_1$ and $2_2$. The two neutral point diodes $D1_1$ and $D2_1$ are accommodated in a module housing, which is illustrated by a dash-dot line 4. The busbars of this three-point phase module are designated differently according to their function. A positive intermediate circuit terminal busbar 6, a negative intermediate circuit terminal busbar 8, a load terminal busbar 10, a neutral point terminal busbar 12 and a branch busbar 14, 16 are provided. In order to better illustrate the electrical connections and leads as busbars, these are each enlarged in their illustration. A plan view of a busbar plane of the low-inductive busbar arrangement according to the present invention for a three-point phase module in accordance with FIG. 1 is illustrated in more detail in FIG. 2. The two intermediate circuit terminal busbars 6, 8 and the load terminal busbar 10 are arranged in this busbar plane. In this case, the two intermediate circuit terminal busbars 6 and 8 are arranged next to one another and the load terminal busbar 10 is spatially arranged opposite and at a predetermined distance from these two intermediate circuit terminal busbars 6 and 8. These three busbars 6, 8 and 10 are each provided with holes 18 corresponding to the associated semiconductor switches $T1_1$, $T4_1$, $T2_1$ and $T3_1$ and each have a terminal lug 20, 22 and 24. The respective terminal lugs 20 and 22 of the positive and negative intermediate circuit terminal busbars 6 and 8 are designed in such a way that a voltage breakdown cannot occur between these two terminal lugs 20 and 22. The part of the negative intermediate circuit terminal busbar 8 opposite the neutral point diode $D1_1$ is configured likewise, thereby enlarging the creepage path between the corner tips of the two intermediate circuit terminal busbars 6 and 8.

Figure 3:
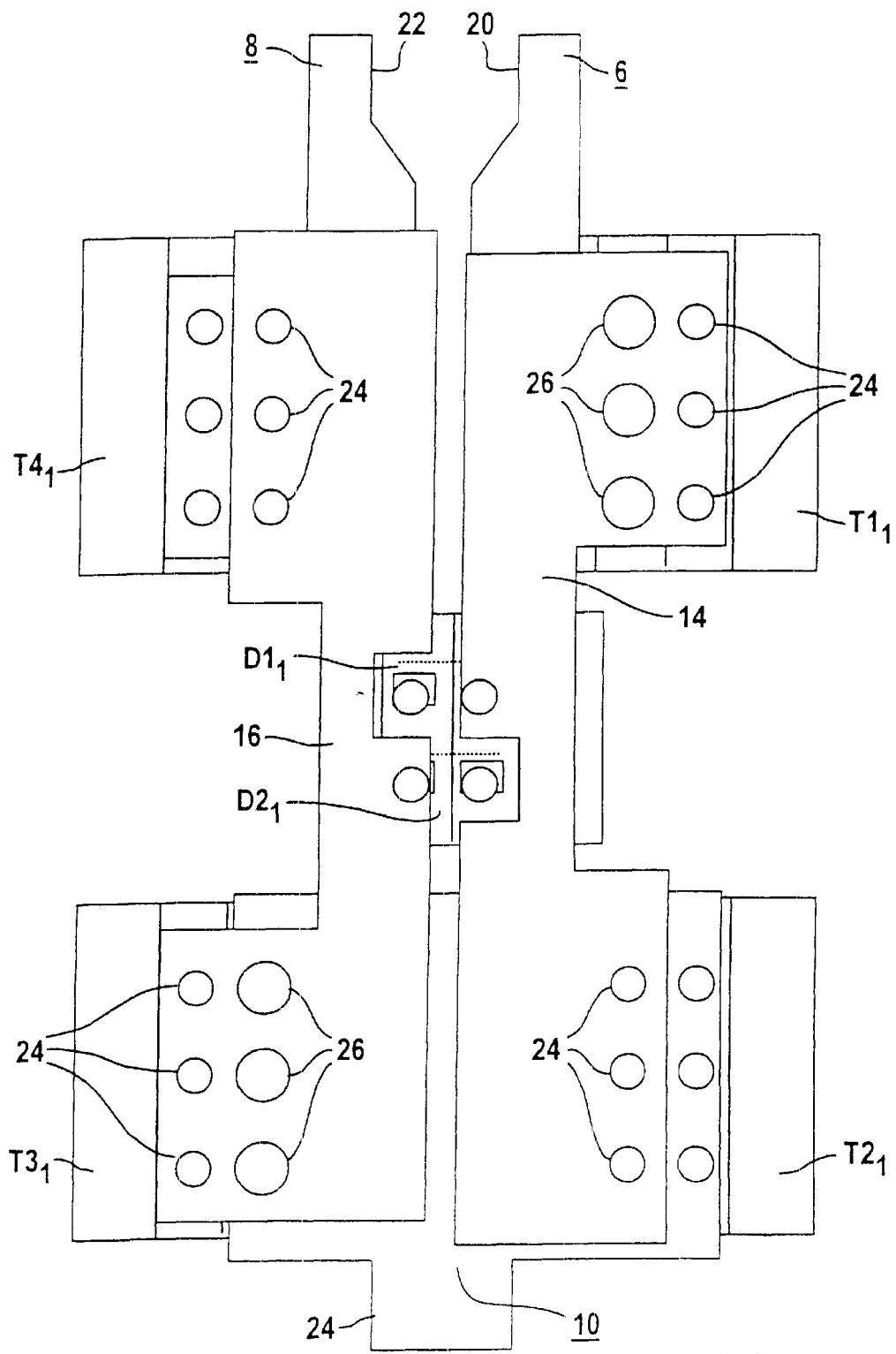
FIG. 3 illustrates a plan view of another busbar plane of the low-inductive busbar arrangement according to the present invention.

FIG. 3 shows a plan view of another busbar plane of the low-inductive busbar arrangement according to the present invention for a three-point phase module in accordance with FIG. 1. The two branch busbars 14 and 16 are illustrated in this busbar plane. The branch busbars 14 and 16 connect the outer semiconductor switch $T1_1$ and $T4_1$, respectively, to the inner semiconductor switch $T2_1$ and $T3_1$, respectively, of the upper and lower bridge half, respectively, of the bridge arm of the three-point phase module. In this illustration, the neutral point diodes $D1_1$ and $D2_1$, are likewise electrically conductively connected to the branch busbar 14 and 16, respectively. The branch busbar 14 and 16 in each case has a recess for the other neutral point diode $D2_1$ and the diode $D1_1$, respectively, which recess is shaped in such a way that the diode $D1_1$ or $D2_1$ is not short-circuited. These branch busbars 14 and 16 also have holes 24 corresponding to the associated semiconductor switches $T1_1$, $T2_1$ and $T4_1$, $T3_1$ in each case in their terminal regions. The busbars 14 and 16 of the second busbar plane have recesses 26 in a manner corresponding to the holes 18 in the busbars 6, 8 and 10 of the busbar plane in accordance with FIG. 2. These recesses 26 are designed in such a way that their diameters are significantly greater than the diameters of the holes 18 and 24. In a particular configuration of the connection busbars 14 and 16, these recesses 26 are provided with a insulating ring. The busbars 8 and 10 of the busbar plane in accordance with FIG. 2 likewise have corresponding recesses in a manner corresponding to the holes 24 in the busbars 14 and 16 of the second busbar plane.

Figure 4:
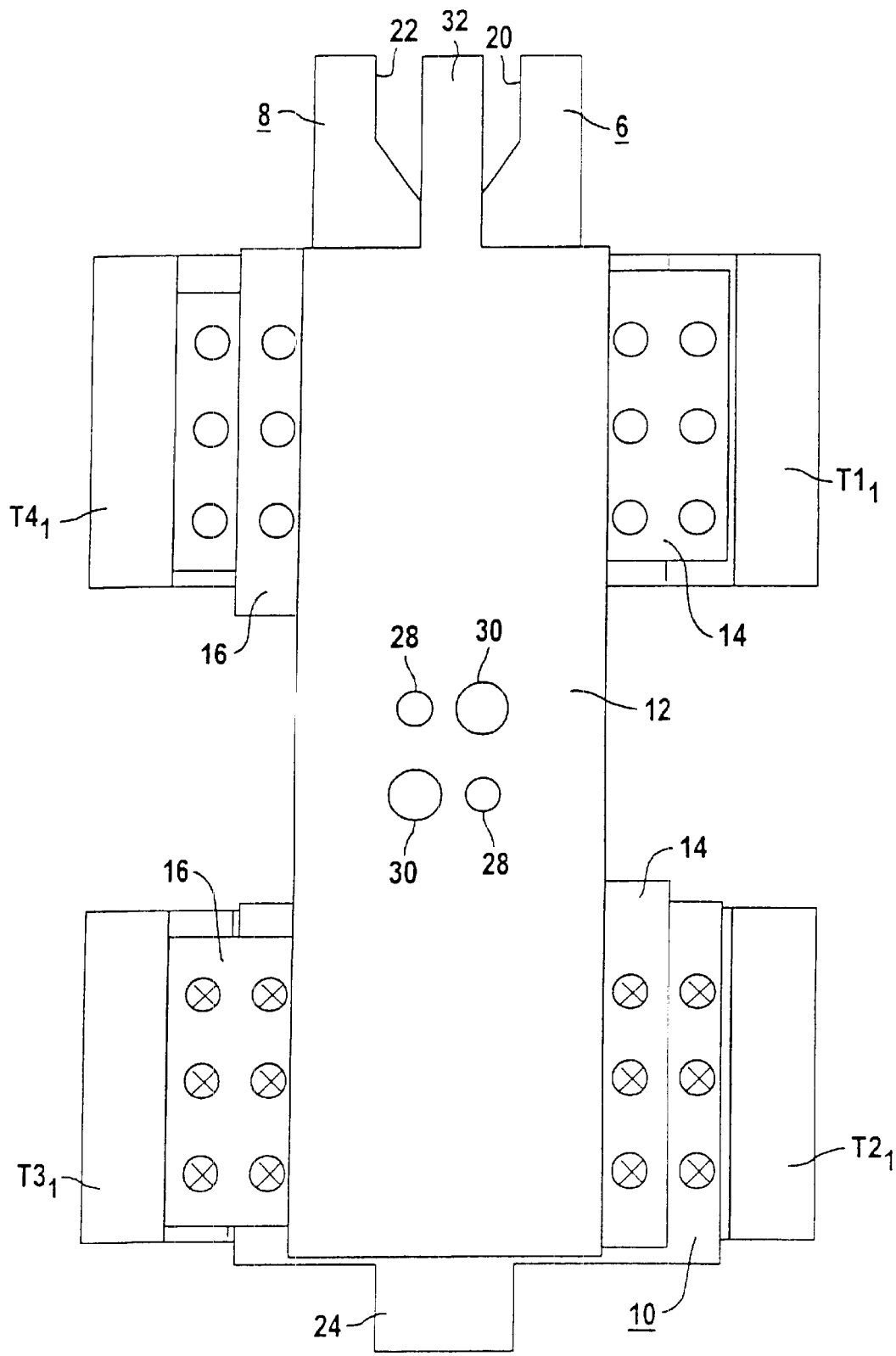
FIG. 4 shows a plan view of a first variant of a further busbar plane.
Figure 5:
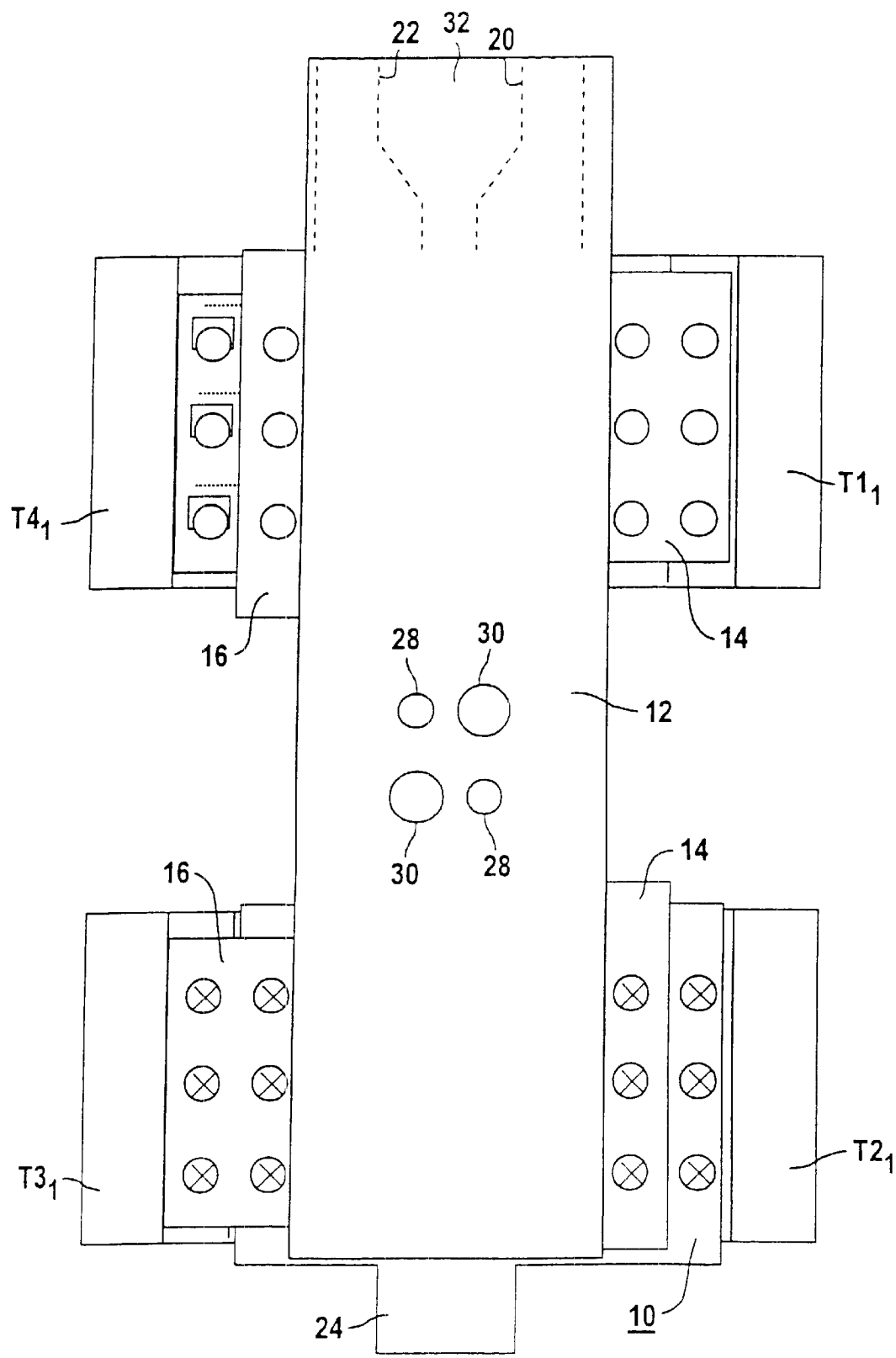
FIG. 5 illustrates a second variant of the further busbar plane.

FIG. 4 illustrates a plan view of a further busbar plane. This further busbar plane has only a neutral point terminal busbar 12. This neutral point terminal busbar 12 has two holes 28 and two recesses 30. The recesses 30 are configured in a manner corresponding to the recesses 26 of the busbars 14 and 16 of the busbar plane in accordance with FIG. 3. The holes 28 in this neutral point terminal busbar 12 are provided for electrically conductively connecting the neutral point diodes $D1_1$ and $D2_1$ to a neutral point terminal M of the three-point phase module. Moreover, this neutral point terminal busbar 12 has a terminal lug 32 which projects between the terminal lugs 20 and 22 of the positive and negative intermediate circuit terminal busbars 6 and 8. Since this neutral point terminal busbar 12 covers the other two busbar planes with the exception of the terminal regions, the value of the leakage inductance for this busbar arrangement is low. FIG. 5 shows a second variant of the neutral point terminal busbar 12. In this exemplary embodiment of the present invention, the terminal lug 32 of the neutral point terminal busbar 12 is designed in such a way that the terminal lugs 20 and 22 of the two intermediate circuit terminal busbars 6 and 8 are covered. As a result, the value of the leakage inductance of this busbar arrangement is reduced even further.

As in the case of the two-layer busbar system discussed above, respective insulating layers are likewise arranged between the busbar planes. In a particularly advantageous embodiment of the low-inductive busbar arrangement, the busbars of the individual busbar planes are adhesively bonded to one another, so that the busbar arrangement can be used as a whole in the construction of a three-point phase module. This significantly simplifies the assembly.

Figure 6:
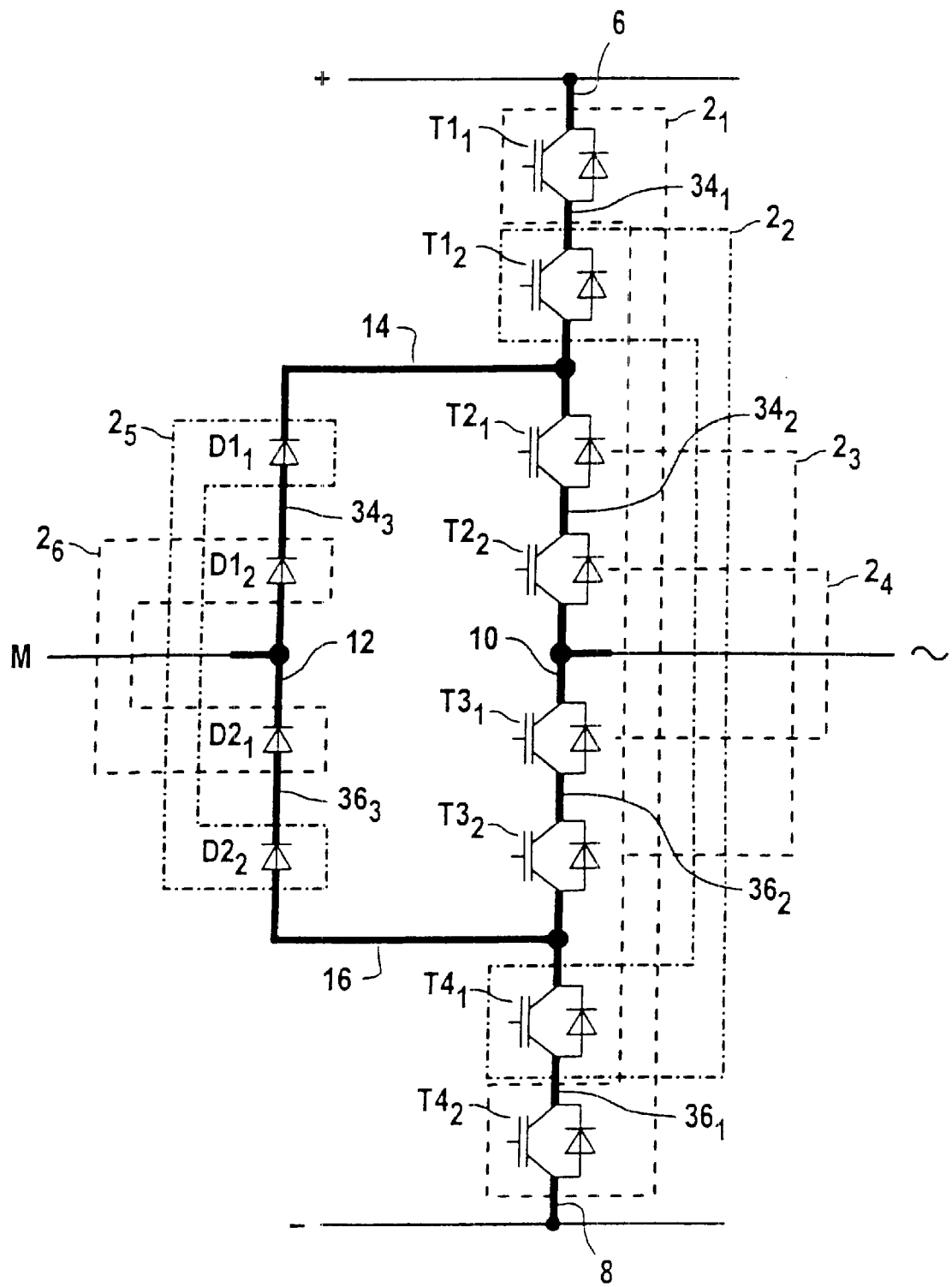
FIG. 6 shows another circuit diagram of a bridge arm of a three-point phase module with two turn-off semiconductor switches per switch (series connection number Two)
Figure 7:
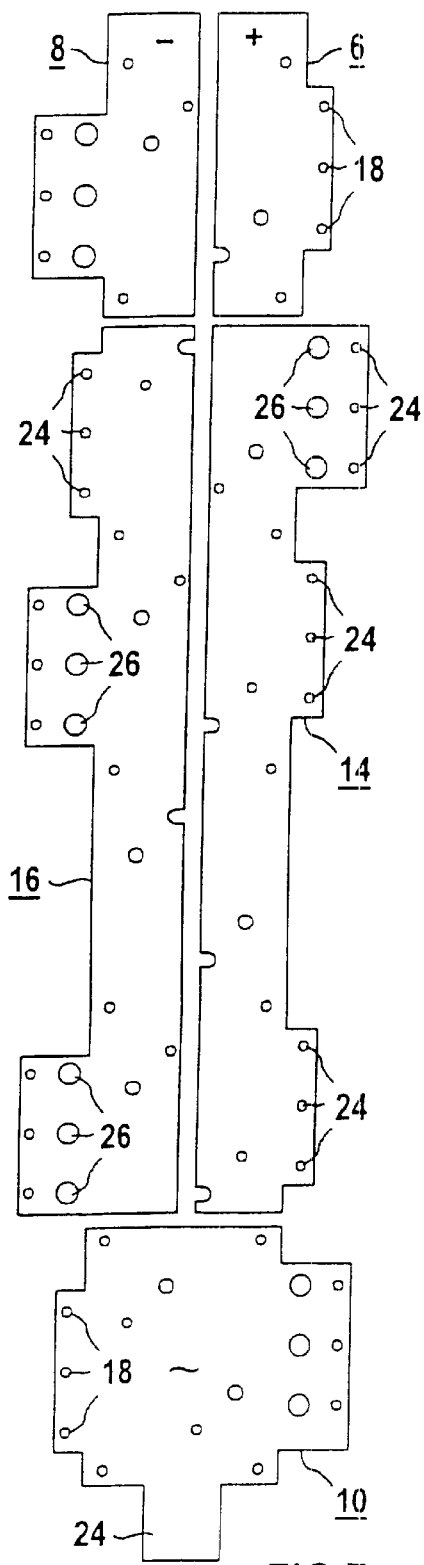
FIG. 7 illustrates a busbar layout of a busbar plane of a low-inductive busbar arrangement according to the present invention, for a three-point phase module according to FIG. 6.
Figure 8:
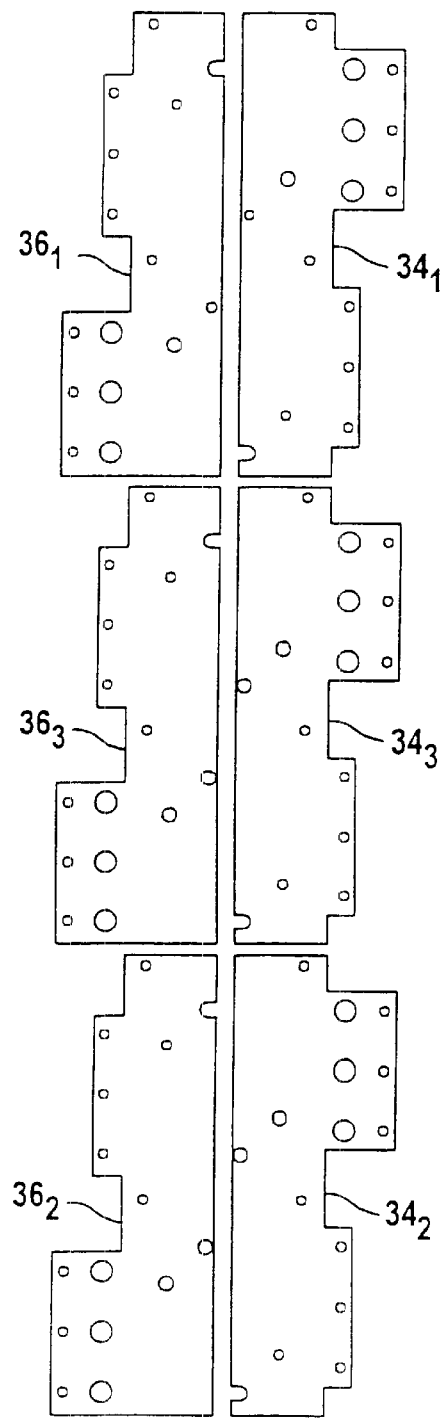
FIG. 8 shows the associated busbar layout of a next busbar plane.
Figure 9:
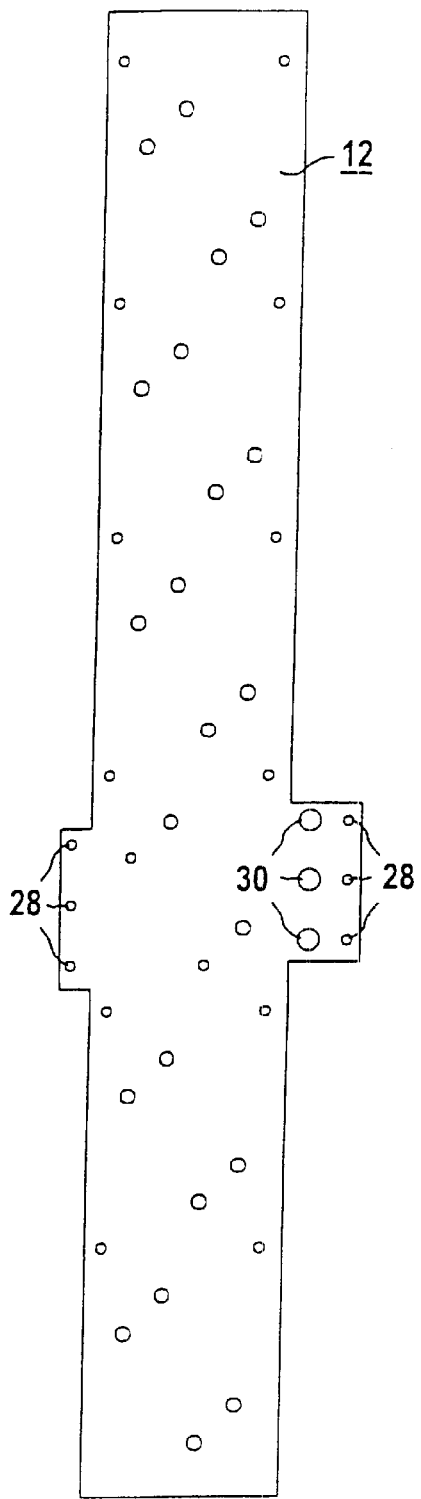
FIG. 9 illustrates the busbar layout of an associated further busbar plane.

FIG. 6 shows a further circuit diagram of a bridge arm of a three-point phase module, which has two semiconductor switches $T1_{1,2}$, $T2_{1,2}$, $T3_{1,2}$ and $T4_{1,2}$ per switch of the bridge arm and two neutral point diodes $D1_{1,2}$ and $D2_{1,2}$ (series connection number Two). Since, in the case of the phase modules with the series connection number Two, a second semiconductor switch $T1_2$, $T2_2$, $T3_2$, and $T4_2$ has been added per switch and a second diode $D1_2$ and $D2_2$ has been added per neutral point diode, six connection busbars $34_1$, $34_2$, $34_3$, $36_1$, $36_2$ and $36_3$ are added to the branch busbars 14 and 16. In this embodiment, the two branch busbars 14 and 16 are not arranged in the busbar plane in accordance with FIG. 3 but rather in the busbar plane in accordance with FIG. 2. These two branch busbars 14 and 16 are spatially arranged between the intermediate circuit terminal busbars 6 and 8 and the load terminal busbar 10 in this busbar plane in accordance with FIG. 1. The arrangement of the busbars 6, 8, 10 and 14, 16 in a busbar plane is illustrated in more detail in FIG. 7. The next busbar plane only has connection busbars $34_{1,2,3}$ and $36_{1,2,3}$ which are each arranged in two rows running next to one another (FIG. 8). In this case, the connection busbars $34_{1,2,3}$ and $36_{1,2,3}$ are all shaped identically. As in the exemplary embodiment with the series connection number One (FIG. 1), the further busbar plane has only a neutral point terminal busbar 12 (FIG. 9).

Figure 10:
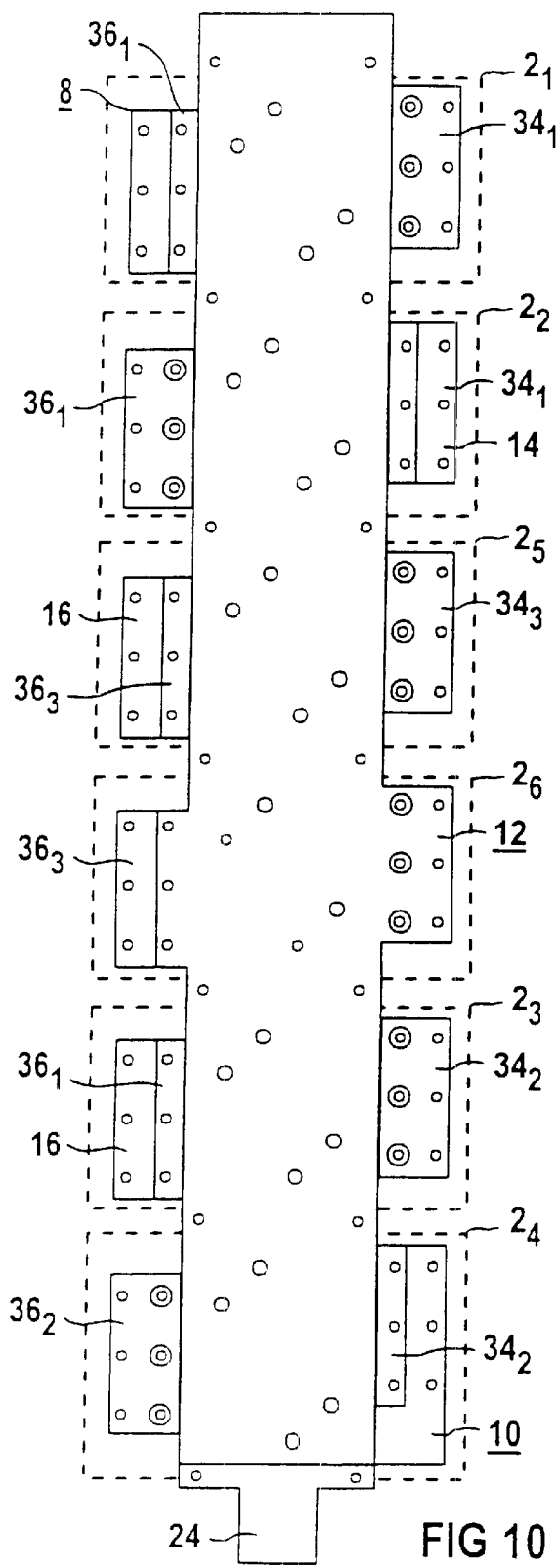
FIG. 10 shows an adhesively bonded low-inductive busbar arrangement for a three-point phase module in accordance with FIG. 6.

FIG. 10 illustrates an adhesively bonded low-inductive busbar arrangement for a three-point phase module with a series connection number Two. Moreover, this figure uses an interrupted line $2_1$ to $2_4$ and $2_5$, $2_6$, to illustrate the respective position of the semiconductor switches $T1_1$, $T4_2$; $T1_2$, $T4_1$; $T2_1$, $T3_2$; $T2_2$, T31 and the respective position of the neutral point diodes $D1_1$, $D2_2$ and $D1_2$, $D2_1$, of the three-point phase module according to FIG. 6.

Figure 11:
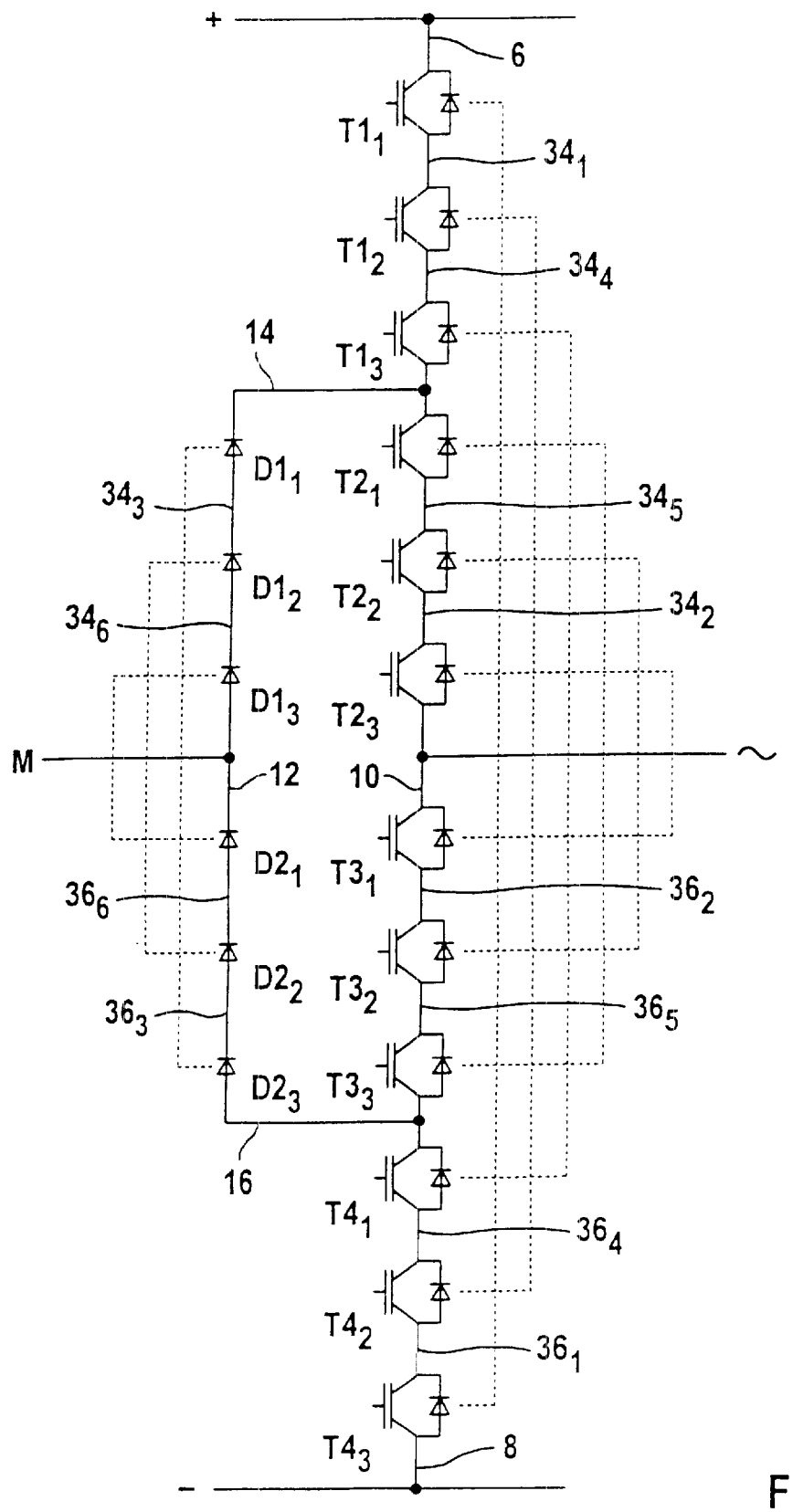
FIG. 11 shows yet another circuit diagram of a bridge arm of a three-point phase module with three turn-off semiconductor switches per switch (series connection number Three)
Figure 12:
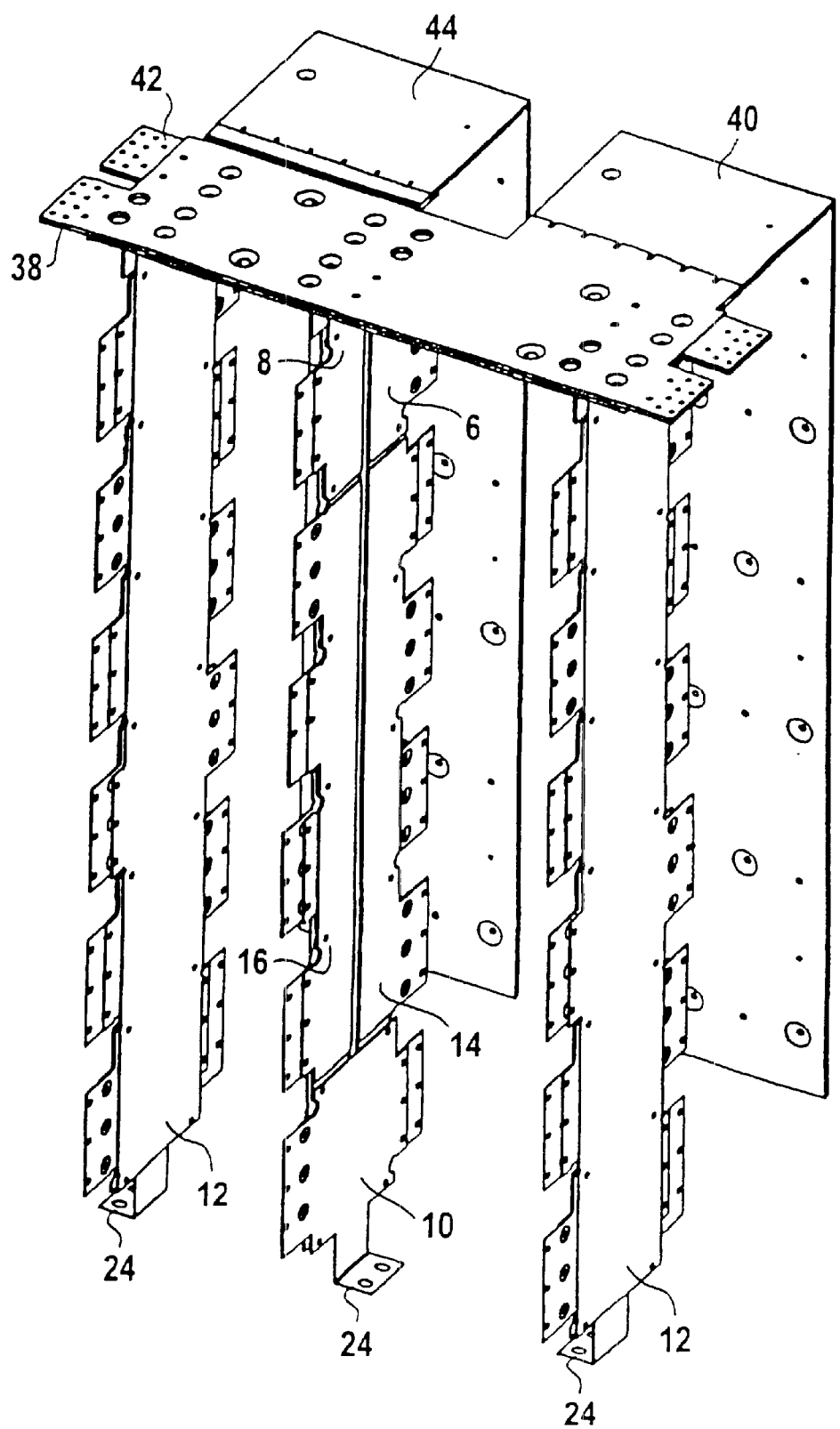
FIG. 12 illustrates a low-inductive busbar arrangement for a three-phase three-point power converter.
Figure 13:
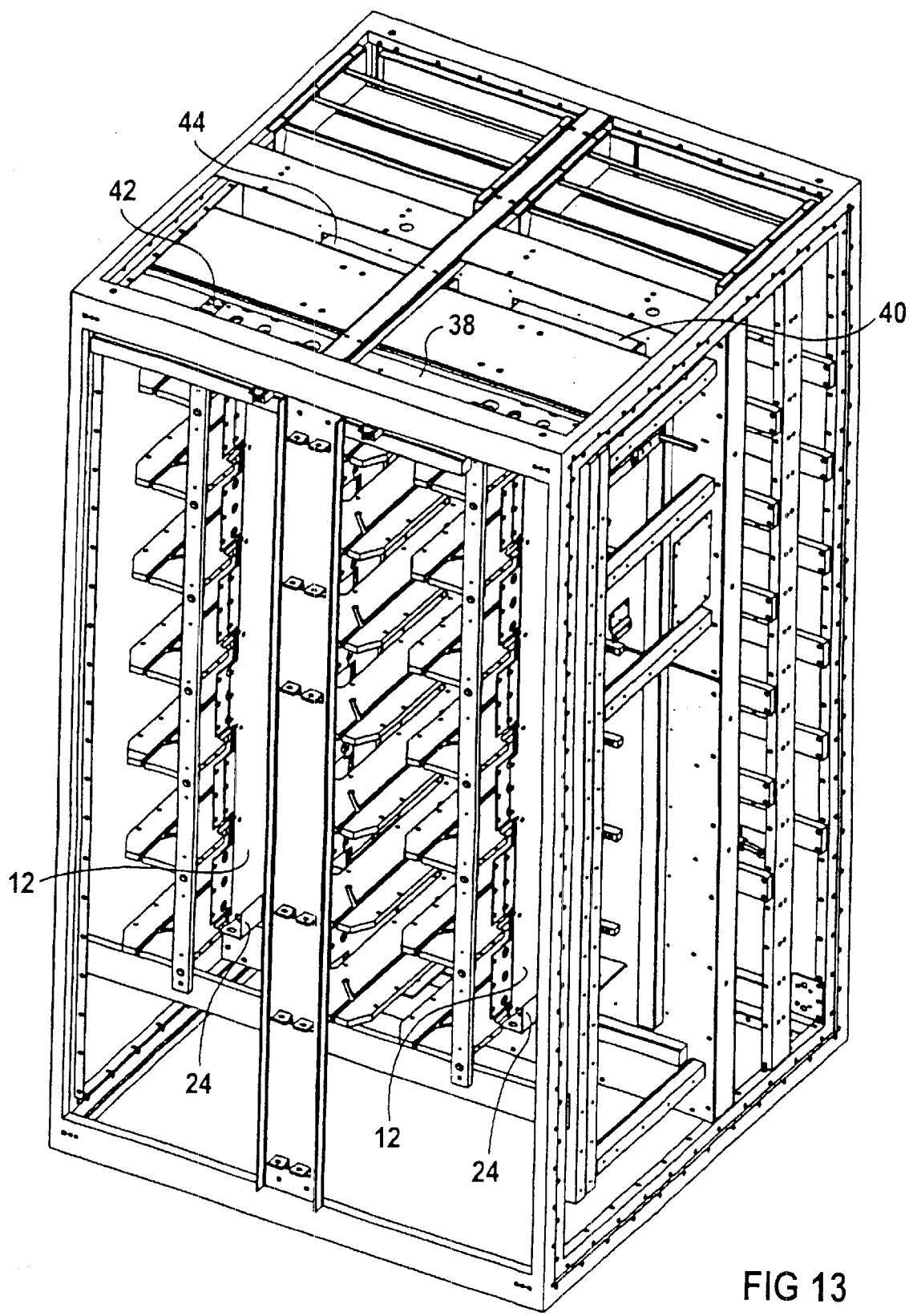
FIG. 13 shows a rack construction of a three-point power converter having the low-inductive busbar arrangement in accordance with FIG. 12.

FIG. 11 illustrates yet another circuit diagram of a bridge arm of a three-point phase module with a series connection number Three. The series connection number Three means that three semiconductor switches $T1_{1,2,3}$, $T2_{1,2,3}$, $T3_{1,2,3}$ and $T4_{1,2,3}$ which are electrically connected in series are used per switch of a three-point bridge arm. A comparison with the circuit diagram in accordance with FIG. 6 shows that three further connection busbars $34_4$, $34_5$, $34_6$ and $36_4$, $36_5$, $36_6$ have been added per semiconductor bridge. In other words, these further connection busbars $34_{4,5,6}$ and $36_{4,5,6}$ are accommodated in the busbar plane. The addition of four further semiconductor switches $T1_3$, $T2_3$, $T3_3$, $T4_3$, and two further neutral point diodes $D1_2$ and $D2_3$ lengthens the spatial construction of the three-point phase module, with the result that, in the busbar plane which already has the connection busbars $34_{1,2,3}$ and $36_{1,2,3}$, there is enough space to be able to accommodate the further connection busbars $34_{4,5,6}$ and $36_{4,5,6}$. In other words, the number of busbar planes of the low-inductive busbar arrangement according to the present invention is always three and thus independent of the series connection number of the three-point phase module. FIG. 12 shows a low-inductive busbar arrangement for a three-phase three-point power converter which uses a low-inductive busbar arrangement according to FIG. 10 for each three-point phase module. The positive intermediate circuit terminal busbars 6 of the phase module busbar arrangements are electrically conductively connected to a positive intermediate circuit busbar 40 by means of a positive shunt busbar 38, whereas the negative intermediate circuit terminal busbars 8 of the phase module busbar arrangements are electrically conductively connected to a negative intermediate circuit busbar 44 by means of a negative shunt busbar 42. FIG. 13 illustrates this busbar arrangement for a three-phase three-point power converter in an associated rack construction.

What is claimed is:
1. A low-inductive busbar arrangement having three planes, comprising:
   a three-point phase module of a polyphase three-point power converter having switches and at least two neutral point diodes, and further including:

at least one turn-off semiconductor switch for each switch of the three-point phase module, at least one diode being provided for each of the neutral point diodes, and terminal, branch and connection busbars distributed between the planes, wherein the planes are mutually electrically insulated from one another via insulation layers, and wherein the planes are arranged parallel to one another.

2. The low-inductive busbar arrangement according to claim 1, wherein the terminal busbars include a neutral point terminal busbar arranged in one of the planes and designed to cover the busbars in the other planes.

3. The low-inductive busbar arrangement according to claim 1, wherein the terminal busbars include a neutral point terminal busbar and intermediate circuit terminal busbars, the neutral point terminal busbar being arranged in one plane of the planes, the intermediate circuit terminal busbars including terminal lugs, the neutral point terminal busbar covering the terminal lugs.

4. The low-inductive busbar arrangement according to claim 1, wherein at least one member of each of the three planes are adhesively bonded to one another.

5. The low-inductive busbar arrangement according to claim 1, wherein the connection busbars are substantially identical.

6. The low-inductive busbar arrangement according to claim 1, wherein the three point phase module includes upper and lower bridge halves, and wherein the connection busbars of the upper bridge half and of the lower bridge half are spatially arranged in a row adjacent to one another.

7. The low-inductive busbar arrangement according to claim 1, wherein two of the planes have a plurality of the busbars distributed thereon.

8. The low-inductive busbar arrangement according to claim 1, wherein the terminal busbars include at least one load terminal busbar, a positive intermediate circuit terminal busbar and a negative intermediate circuit terminal busbar which are arranged in one of the at least three planes.

9. The low-inductive busbar arrangement according to claim 1, wherein the connection busbars are provided in two components of the three-point phase module, the components being electrically connected in series to one another and being arranged in one of the planes.

10. The low-inductive busbar arrangement according to claim 1, wherein the terminal busbars include a neutral point terminal busbar which extends along one of the at the planes.

11. The low-inductive busbar arrangement according to claim 1, wherein the branch busbars and terminal busbars are arranged together in at least one of the planes.

12. The low-inductive busbar arrangement according to claim 1, wherein the terminal busbars include intermediate circuit terminal busbars which are adjacently arranged in one of the planes.

13. The low-inductive busbar arrangement according to claim 1, wherein the terminal busbars include a load terminal busbar and intermediate circuit terminal busbars, and wherein at least two branch busbars are arranged spatially adjacent to one another and provided between the intermediate circuit terminal busbars and the load terminal busbar.

14. The low-inductive busbar arrangement according to claim 1, wherein each busbar of the busbars which is arranged in at least one of the planes has holes corresponding to components of the three-point phase module.

15. The low-inductive busbar arrangement according to claim 1, wherein at least one of the terminal, branch and connection busbars are associated with an element which is provided in a group consisting of the switch and the neutral point diodes.

16. A low-inductive busbar arrangement for a polyphase three-point power converter, comprising:

a three-point phase module comprising:

a positive shunt busbar;

a negative shunt busbar; and an inductive busbar arrangement including a positive intermediate circuit terminal busbar and a negative intermediate circuit terminal busbar which are electrically conductively connected to one another via the positive and negative shunt busbars.

* * * * *